US008871605B2

(12) United States Patent
Lin et al.

(10) Patent No.: US 8,871,605 B2
(45) Date of Patent: Oct. 28, 2014

(54) METHODS FOR FABRICATING AND ORIENTING SEMICONDUCTOR WAFERS

(75) Inventors: Chin-Ming Lin, Jhunan Township, Miaoli County (TW); Wan-Lai Chen, Hsinchu (TW); Chia-Hung Huang, Hsinchu (TW); Chi-Ming Yang, Hsinchu (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/449,721

(22) Filed: Apr. 18, 2012

(65) Prior Publication Data

US 2013/0280922 A1   Oct. 24, 2013

(51) Int. Cl.
  *H01L 21/76* (2006.01)

(52) U.S. Cl.
  USPC ................................... 438/401; 257/E21.525

(58) Field of Classification Search
  USPC .................... 438/14, 401, 462, 975; 257/797, 257/E21.525, E23.179
  See application file for complete search history.

(56) References Cited

U.S. PATENT DOCUMENTS

| | | | |
|---|---|---|---|
| 5,876,819 A | | 3/1999 | Kimura et al. |
| 7,057,259 B2 * | | 6/2006 | Arikado et al. ............... 257/618 |
| 7,672,502 B2 * | | 3/2010 | Osada et al. .................. 382/151 |
| 2003/0003608 A1 | | 1/2003 | Arikado et al. |
| 2006/0269851 A1 * | | 11/2006 | Frisa et al. ........................ 430/5 |

FOREIGN PATENT DOCUMENTS

| | | |
|---|---|---|
| JP | 08-339946 | 12/1996 |
| JP | 2007-523371 | 8/2007 |
| KR | 2002-0075282 | 10/2002 |
| WO | 2005079470 A2 | 9/2005 |

OTHER PUBLICATIONS

Virginia Semiconductor, Inc., "Optical Properties of Silicon", 11 pages. Retrieved from: <http://www.virginiasemi.com/pdf/Optical%20Propertiee%20of%20Silicon71502.pdf>.

Official Action issued Aug. 31, 2013 in counterpart Korean Patent Application No. 10-2012-0075975.

Official Action issued Apr. 2014 in counterpart Korean Patent Application No. 10-2012-0075975.

* cited by examiner

*Primary Examiner* — Quoc Hoang
(74) *Attorney, Agent, or Firm* — Duane Morris LLP (57) ABSTRACT

A method of orienting a semiconductor wafer. The method includes rotating a wafer about a central axis; exposing a plurality of edge portions of the rotating wafer to light having a predetermined wavelength from one or more light sources; detecting a subsurface mark in one of the plurality of edge portions of the rotating wafer; and orienting the wafer using the detected subsurface mark as a reference.

19 Claims, 8 Drawing Sheets

METHODS FOR FABRICATING AND ORIENTING SEMICONDUCTOR WAFERS

FIELD

The present disclosure relates generally to semiconductor fabrication, and more specifically to methods for fabricating semiconductor wafers.

BACKGROUND

Semiconductor wafers are conventionally formed with a notch to orient the wafers and provide a reference for wafer handling machinery. Processes for forming the notch typically involve grinding a surface of the wafer or the ingot. These processes adversely affect semiconductor process performance. For example, uniformity of the thickness of a photoresist coating, or chemical mechanical polishing (CMP) film thickness, across the surface of the wafer can be degraded by the presence of the notch. Plasma density and chemical distribution for etching processes can also be adversely impacted by the notch. Additional costs are associated with compensating for these degradations in process performance. The notch is also a particle source resulting in wafer contamination (especially during high vacuum processes), equipment damage, and additional preventative maintenance requirements to avoid equipment damage.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved processes for fabricating semiconductor wafers and orienting semiconductor wafers are provided. The inventors have observed that by forming a subsurface mark in a semiconductor wafer, a detectible marker is provided that permits wafer orientation to be accomplished accurately and efficiently while minimizing the effect on semiconductor process performance. The inventors have observed that forming a subsurface mark in a semiconductor wafer permits orienting the wafer while avoiding non-uniformities across a wafer surface, for example, in photoresist coating thickness, chemical mechanical polish (CMP) film thickness, plasma density for etching processes, and chemical distribution for etching processes. The inventors have determined that the methods described herein improve yield and avoid costs associated with additional processes designed to obviate these non-uniformities across a wafer surface. The inventors have further determined that the methods described herein will avoid wafer contamination, equipment damage, and additional preventative maintenance requirements to avoid equipment damage, that are associated with providing a reference notch to orient the wafer.

Figure 1:
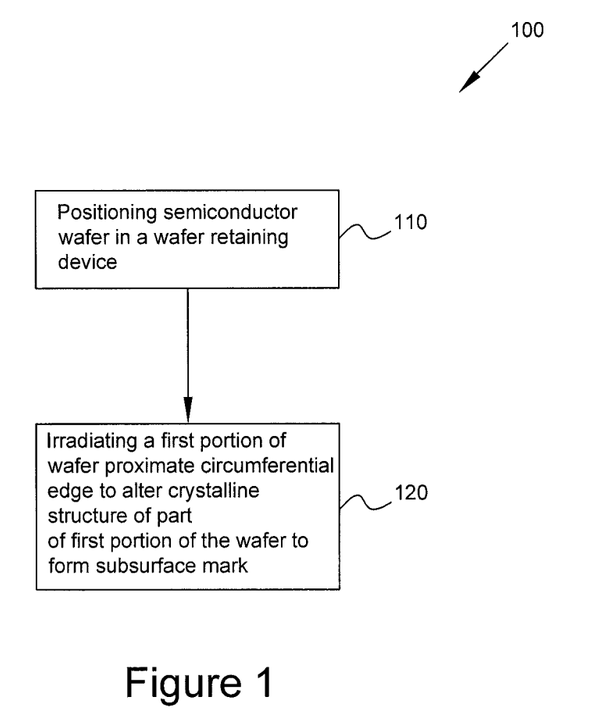
FIG. 1 is a flow chart illustrating a method according to embodiments of the present disclosure.

FIG. 1 is a flow chart illustrating a method according to embodiments of the present disclosure. At block 110, a semiconductor wafer is positioned in a wafer retaining device. In various embodiments, the wafer retaining device is a chuck.

In some embodiments, the wafer retaining device is an electrostatic chuck (ESC). For example, a semiconductor wafer can be supported by a pedestal (e.g. a platen) or other support platform (e.g. carousel spatula) that provides a support surface for a semiconductor wafer. In various embodiments, the wafer is retained to the pedestal using a chuck, such as, for example, an electrostatic chuck.

At block 120, a predetermined first portion of the wafer proximate a circumferential edge of the wafer is irradiated so as to alter a crystalline structure of at least part of the first portion of the wafer to form a subsurface mark in the crystalline structure, wherein the subsurface mark is detectable using light. In various embodiments, a light source irradiates the predetermined first portion of the wafer. In some embodiments, a laser is the light source that irradiates the predetermined first portion of the wafer. By way of example, a Nd-YAG laser can be used to irradiate the predetermined first portion of the wafer. The light source can be mounted on a rail and movable by a linear actuator, for example, towards or away from a central axis of the wafer to accommodate various wafer sizes. For example, the size of the semiconductor wafer can be, but is not limited to, a size of 1-inch (25 mm), 2-inch (51 mm), 3-inch (76 mm) 4-inch (100 mm) 5-inch (130 mm), 125 mm, 150 mm, 200 mm, 300 mm or 450 mm. In various embodiments, the predetermined first portion is disposed outside of the functional area of the wafer. As used herein, a functional area of the wafer is an area where integrated circuit (IC) dies are to be formed. In various embodiments, the predetermined first portion is disposed in an edge exclusion area of the wafer. For example, for a 150 mm wafer, an edge exclusion area can be a circumferential area disposed 2 mm radially inward from the edge of the wafer and about the circumference of the wafer where IC dies are absent or not used if present.

In various embodiments, a laser is directed at the first portion of the wafer. In some embodiments, the first portion can include a surface of the wafer. In some embodiments, a laser is directed and focused at the part of the first portion of the wafer to alter its crystalline structure. In various embodiments, a lens is used to focus the light from the light source at the part of the first portion of the wafer. Any suitable lens can be used to focus light from the light source. By way of example, a laser light source can be turned on and laser light can be focused by a lens and directed along an axis of irradiating at the part of the first portion of the wafer to form a subsurface mark. In various embodiments, the crystalline structure of the part of the first portion of the wafer is altered by melting the part of the first portion of the wafer. In some embodiments, a molten zone is formed in the first portion of the wafer. A molten zone can be a part of the first portion of the wafer where the crystalline structure is altered by a melting process. A subsurface mark can be formed at the molten zone of the wafer.

In various embodiments, the crystalline structure of at least a second part of the first portion of the wafer is maintained. In some embodiments, the at least part of the first portion of the wafer is less than the entire first portion, such that a focused, laser light alters the crystalline structure of a part, but not all, of the entire first portion. For example, the first portion of the wafer is located along an axis of irradiating and can include a surface of the wafer, and the crystalline structure of a part, but not all, of the first portion can be altered by the irradiating process.

In various embodiments, the subsurface mark is detectable using light. One or more subsurface mark searching units can provide the light to detect the subsurface mark. In some embodiments, a plurality of subsurface mark searching units are positioned or movably positionable for detecting the subsurface mark proximate a circumferential edge of the wafer. For example, two subsurface mark searching units can be positioned or movably positionable directly along a line segment that passes through an axis. Each subsurface mark searching unit can include a light source, a lens and a sensor. In some embodiments, the sensor can be a CMOS or a CCD imaging sensor to detect the subsurface mark.

In various embodiments, a subsurface mark is detected using light of a predetermined wavelength. In some embodiments, the subsurface mark is detectable using infrared radiation. For example, the subsurface mark can be detectable using infrared radiation having a wavelength of at least 1.1 micrometers. In some embodiments, the subsurface mark is detectable using infrared radiation having a wavelength between 1.1 micrometers and 1.5 micrometers. In various embodiments, the light source is an infrared light source that emits infrared light at a predetermined wavelength. In some embodiments, a sensor in a subsurface mark searching unit is an infrared sensor. In some embodiments, a subsurface mark is detectable using x-ray inspection. For example, the light source can be an x-ray source that emits x-rays at a predetermined wavelength. In some embodiments, a sensor in a subsurface mark searching unit is a x-ray sensor. The inventors have determined that by forming a subsurface mark proximate a circumferential edge of a wafer using irradiation, a reference is provided to orient the wafer while avoiding wafer contamination, equipment damage, and additional preventative maintenance to avoid equipment damage, that are associated with using a notch, for providing a reference to orient the wafer.

Figure 2:
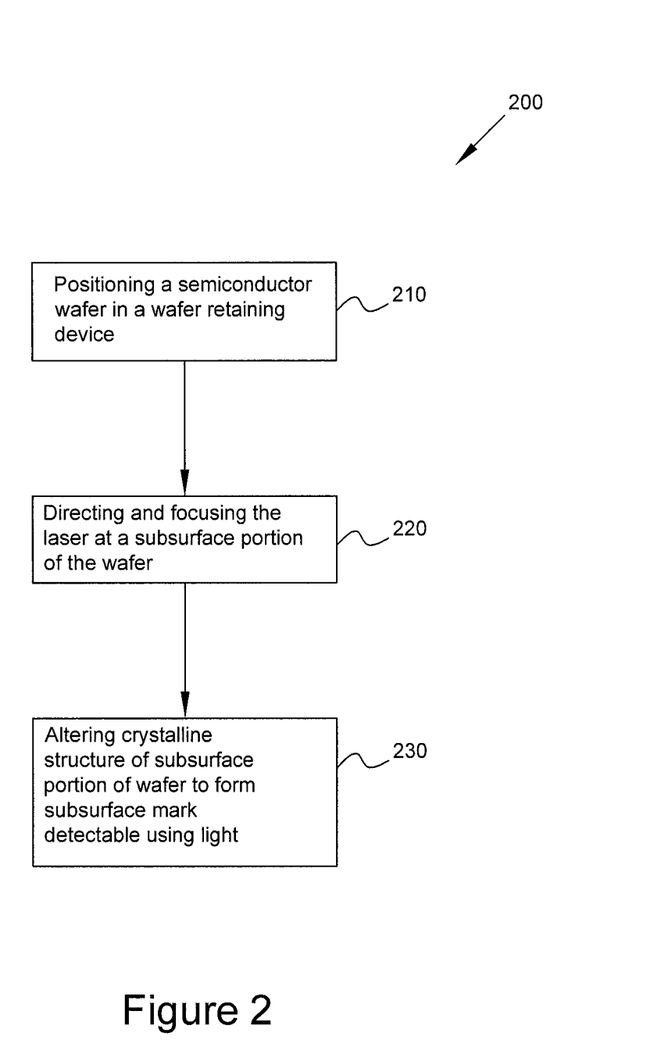
FIG. 2 is a flow chart illustrating a method according to some embodiments.

With reference now to FIG. 2, a flow chart illustrating a method according to some embodiments is provided. At block 210, a semiconductor wafer is positioned in a wafer retaining device as described above at block 110. At block 220, a laser is directed and focused at a subsurface portion of the wafer. In various embodiments, the laser can be directed and focused at a subsurface portion of the wafer using a lens. At block 230, a crystalline structure of the subsurface portion of the wafer is altered to form a subsurface mark. In various embodiments, the crystalline structure of the subsurface portion of the wafer is altered by melting the subsurface portion of the wafer. In some embodiments, a molten zone is formed at the subsurface portion of the wafer where the crystalline structure is altered by a melting process. A subsurface mark can be formed at the molten zone of the wafer.

Figure 3A:
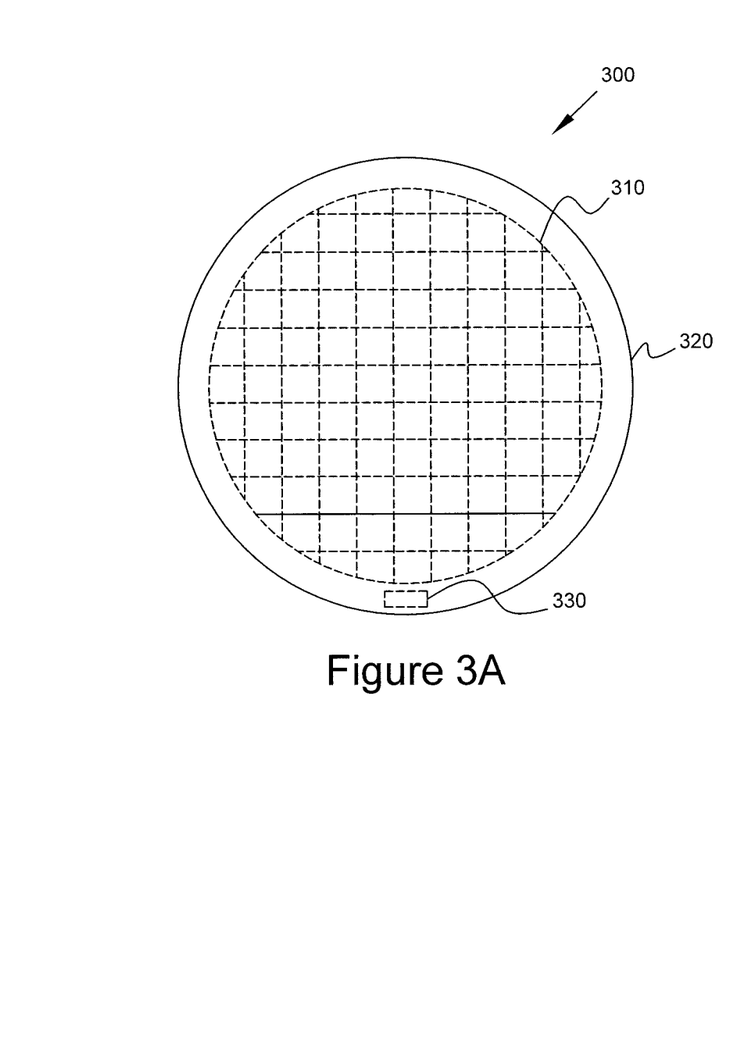
FIG. 3A is a schematic diagram illustrating a plan view of an example of a semiconductor wafer according to embodiments of the present disclosure.
Figure 3B:
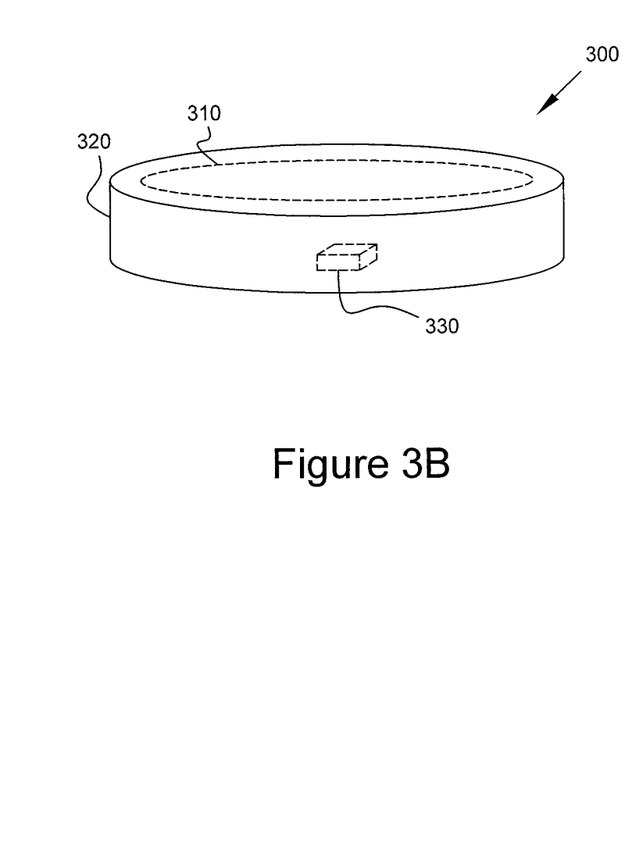
FIG. 3B is a schematic diagram illustrating a perspective view of an example of a semiconductor wafer according to some embodiments.

Referring now to FIG. 3A, a schematic diagram illustrating a plan view of an example of a semiconductor wafer 300 according to embodiments of the present disclosure is provided. As shown, a subsurface mark 330 is formed in an area of the wafer 300 between a circumferential boundary 310 of the functional area of the wafer 300 and a circumferential edge 320 of the wafer 300. In the illustrated embodiment, the dashed lines represent various regions of the wafer 300 where dies can be formed subsequent to formation of a semiconductor mark 330. In various embodiments, the area between the circumferential boundary 310 and the circumferential edge 320 is an edge exclusion area of the wafer 300. Formation of dies is excluded from the edge exclusion area. With reference now to FIG. 3B, a schematic diagram illustrating a perspective view of an example of a semiconductor wafer 300 according to some embodiments is provided. Subsurface mark 330 is shown as having a substantially rectangular shape in the illustrated embodiment. However, the subsurface mark 330 can have any shape formed by altering the crystalline structure of a subsurface portion of the wafer 300 using irradiation as described herein.

Figure 4A:
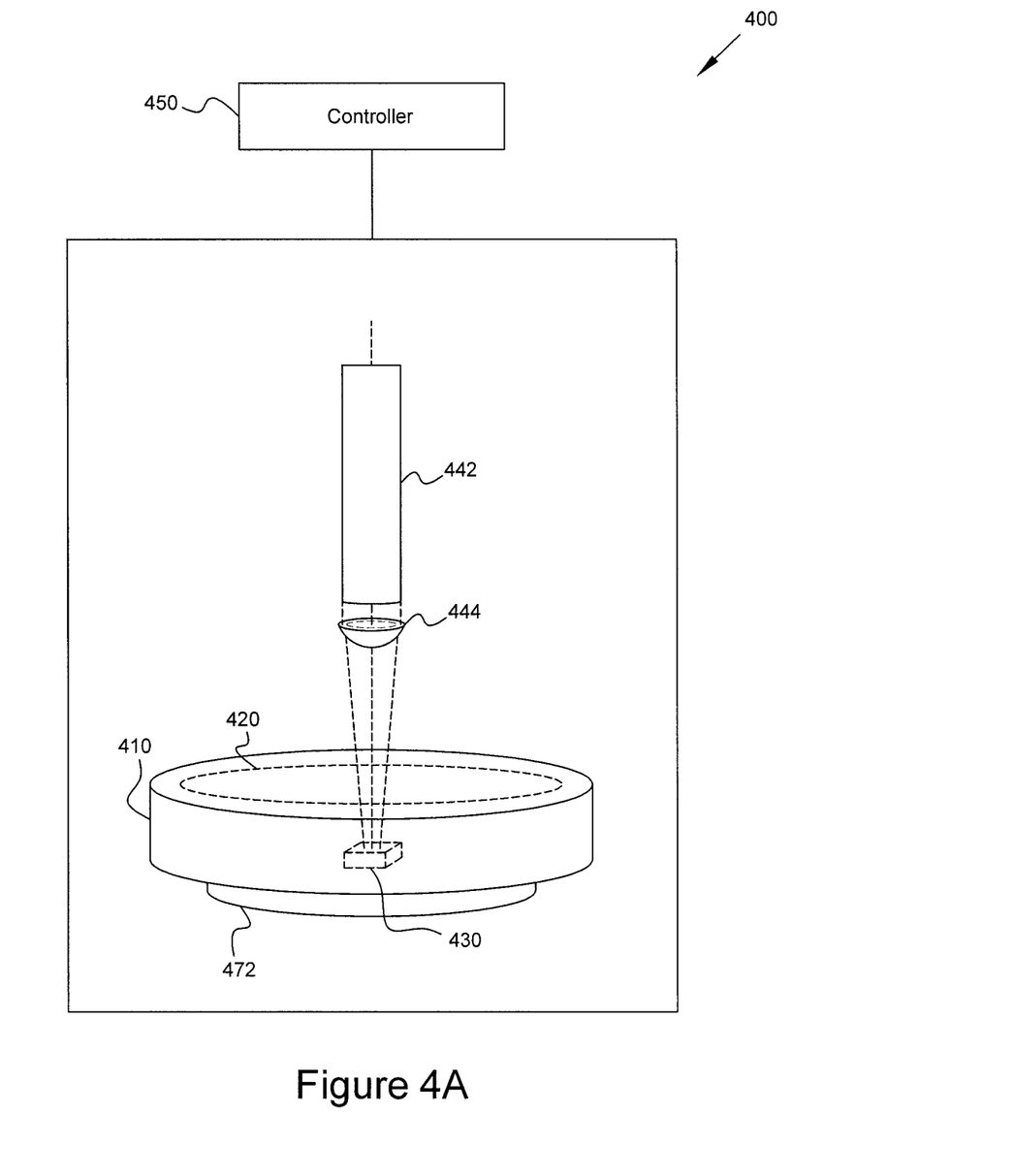
FIG. 4A is a schematic diagram illustrating a perspective view of an example of a subsurface mark forming apparatus according to embodiments of the present disclosure.
Figure 4B:
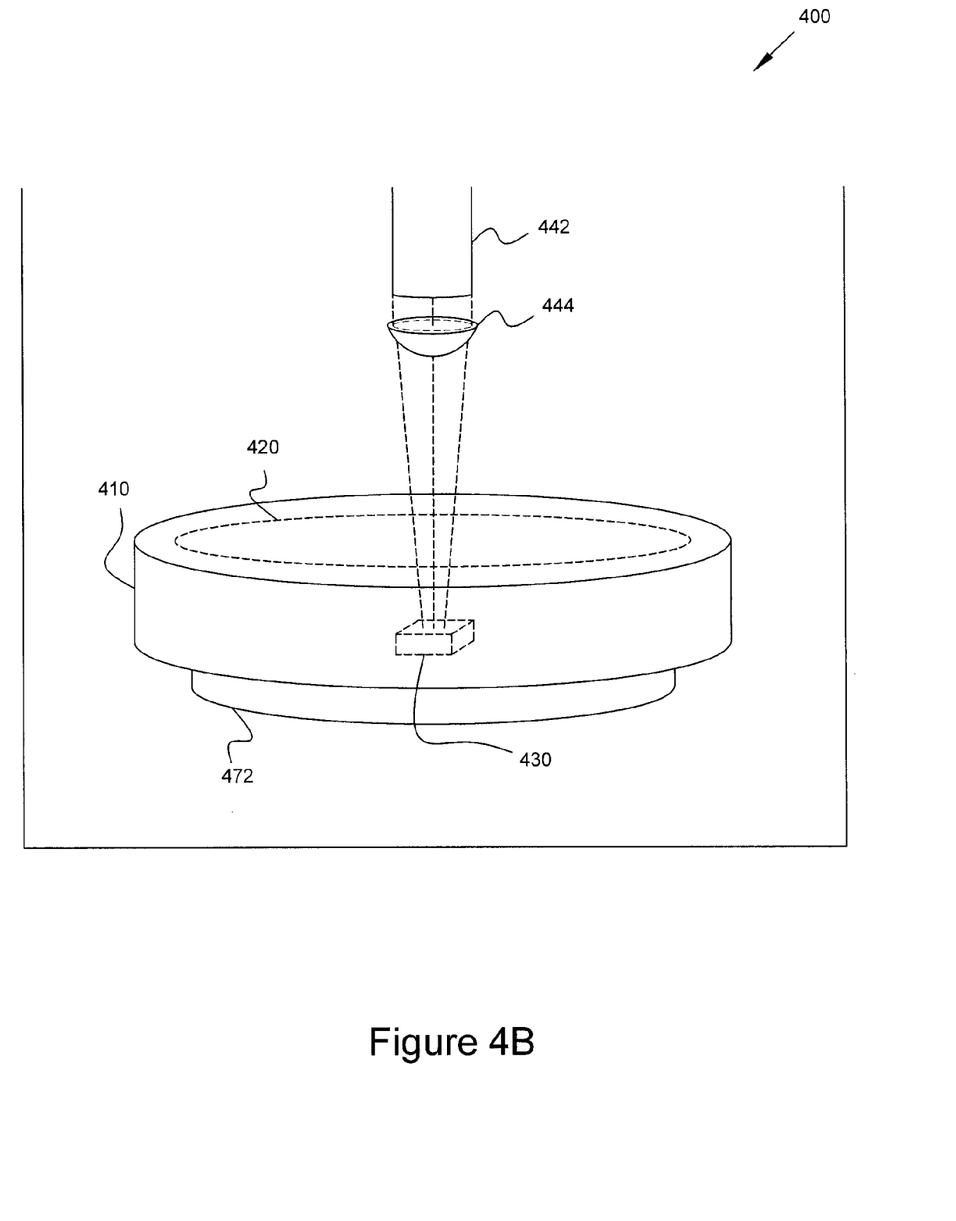
FIG. 4B is a schematic diagram illustrating a perspective view of an example of a subsurface mark forming apparatus according to embodiments of the present disclosure.

FIGS. 4A and 4B show an example of a semiconductor wafer subsurface mark forming apparatus 400 according to some embodiments. A light source 442 is provided. In some embodiments, light source 442 is a laser. In some embodiments, light source 442 is positioned along an axis of a retaining device (472) for retaining the semiconductor wafer. In other embodiments, light source 442 is one of a plurality of light sources positioned or movably positionable with a common radial distance from the axis of the retaining device (not shown) for retaining the semiconductor wafer. In various embodiments, light source 442 can include a light emitter, such as for example, a laser or a light emitting diode (LED). In some embodiments, light source 442 emits light at a predetermined wavelength. In other embodiments, a filter can be used to filter the wavelength of light emitted by the light source to that of a predetermined wavelength. The apparatus 400 can include a lens 444 for focusing the light from the light source 442. Any suitable lens can be used to focus light from the light source on a predetermined portion of the semiconductor wafer to form a subsurface mark 430. In some embodiments, the predetermined portion of the wafer is part of the edge exclusion area of the wafer. For example, light from a laser light source 442 can be focused by lens 444 and directed along an axis of irradiating at a portion of the wafer between circumferential boundary 420 and the circumferential edge 410 to form a subsurface mark 430. In various embodiments, controller 450 controls the apparatus to irradiate a portion of the wafer to form a subsurface mark. In some embodiments, the controller 450 is an embedded microprocessor. In various embodiments, the controller 450 is a digital signal processor implemented in application specific integrated circuitry (ASIC). In some embodiments, the controller 450 can be a networked computer or a programmable logic controller.

Figure 5:
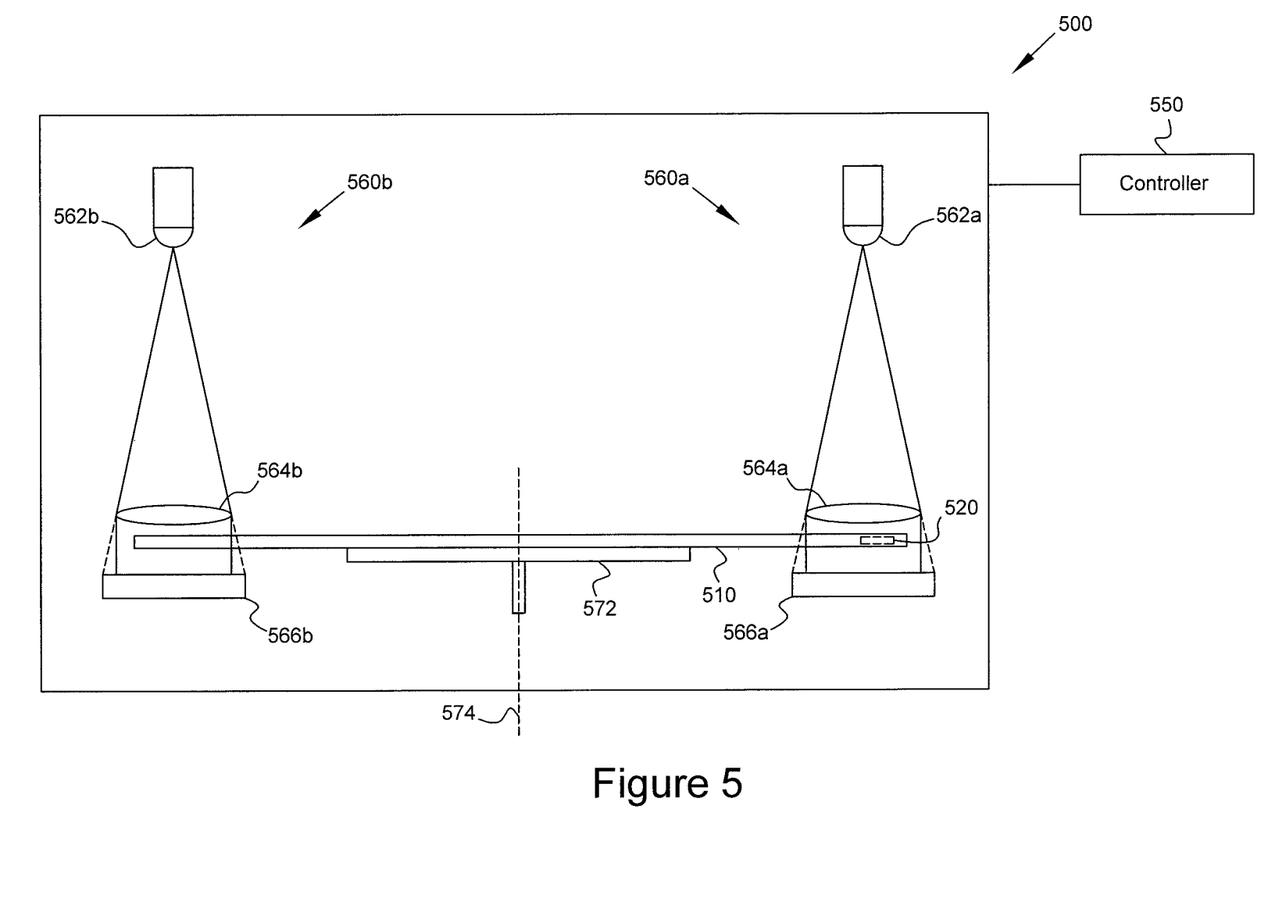
FIG. 5 is a schematic diagram illustrating a side view of a subsurface mark detecting apparatus according to embodiments of the present disclosure.

FIG. 5 provides a schematic diagram illustrating a side view of an example of a subsurface mark detecting apparatus 500. Subsurface mark detecting apparatus 500 includes at least one subsurface mark detecting unit (560a). In some embodiments, subsurface mark detecting apparatus 500 includes a plurality of subsurface mark detecting units (560a, 560b). FIG. 5 shows two subsurface mark detecting units 560a and 560b in schematic. Subsurface mark detecting apparatus 500 can include a chuck 572 for supporting and/or retaining a semiconductor wafer 510. In some embodiments, the chuck 572 is an electrostatic chuck. The chuck 572 can be rotatable about a central axis 574. In various embodiments, the subsurface mark detecting units 560a and 560b are positioned or movably positionable for detecting a subsurface mark 520 proximate a circumferential edge of the wafer 510. As shown in FIG. 5, the plurality of subsurface mark detecting units can include two subsurface mark detecting units 560a, 560b positioned or movably positionable opposite from each other along a line segment that passes through the axis 574.

Each subsurface mark detecting unit (560a, 560b) can include a light source 562a, 562b, a lens 564a, 564b, and a sensor 566a, 566b which can include, for example, a CCD or CMOS imaging sensor. In some embodiments, the subsurface mark detecting unit (560a, 560b) can include a light filter, for example, an infrared filter. In some embodiments, one or more of the subsurface mark detecting units 560a, 560b can be mounted on a rail and movable by, for example, a linear actuator towards or away from axis 574, to accommodate different sized wafers. Upon positioning the wafer 510 on the chuck 572, the subsurface mark detecting unit 560a, 560b can be actuated toward the axis 574, until sensor 566a, 566b detects a subsurface mark proximate a circumferential edge of the wafer 510. In various embodiments, subsurface mark detecting unit 560a, 560b detects subsurface mark 520 using light from light source 562a, 562b of a predetermined wavelength. For example, light having a wavelength in the visible spectrum (e.g. for a typical human eye between approximately 390 nanometers and 790 nanometers) cannot transmit through semiconductor wafer 510. However, the inventors have determined that light having a predetermined wavelength with a known transmittance through semiconductor wafer 510 can be used to detect a subsurface mark 520. In various embodiments, the subsurface mark 520 can have an altered crystalline structure while the crystalline structure outside of the subsurface mark 520 can be maintained. Subsurface mark detecting apparatus 560a, 560b can be used to detect changes in transmittance of light at a predetermined wavelength and proximate a circumferential edge of wafer 510 where a subsurface mark 520 can be formed.

In various embodiments, light source 562a, 562b is an infrared light source that emits infrared light at a predetermined wavelength. In various embodiments, the light emitted from light source 562a, 562b is infrared radiation. For example, the light emitted from light source 562a, 562b can have a wavelength of at least 1.1 micrometers to detect subsurface mark 520. In some embodiments, the light emitted from light source 562a, 562b can have a wavelength between approximately 1.1 micrometers and approximately 1.5 micrometers (e.g. 1.05 to 1.55 micrometers) to detect subsurface mark 520. For example, light having a wavelength of 1.1 micrometers can have a transmittance through the semiconductor wafer of approximately 70%. A formed subsurface mark 520 can be detected by monitoring for changes in light transmittance proximate a circumferential edge of wafer 510. In some embodiments, sensors 566a, 566b in subsurface mark searching units 560a, 560b are infrared sensors. In various embodiments, light source 560a, 560b can be an x-ray source that emits x-rays at a predetermined wavelength. For example, the light emitted from light source 560a, 560b can have a wavelength between 0.01 and 10 nanometers. In some embodiments, sensors 566a, 566b in subsurface mark searching units 560a, 560b are x-ray sensors or x-ray detectors. In various embodiments, controller 550 controls the apparatus to detect subsurface mark 520. In some embodiments, the controller 550 is an embedded microprocessor. In various embodiments, the controller 550 is a digital signal processor implemented in application specific integrated circuitry (ASIC). In some embodiments, the controller 550 can be a networked computer or a programmable logic controller.

Figure 6:
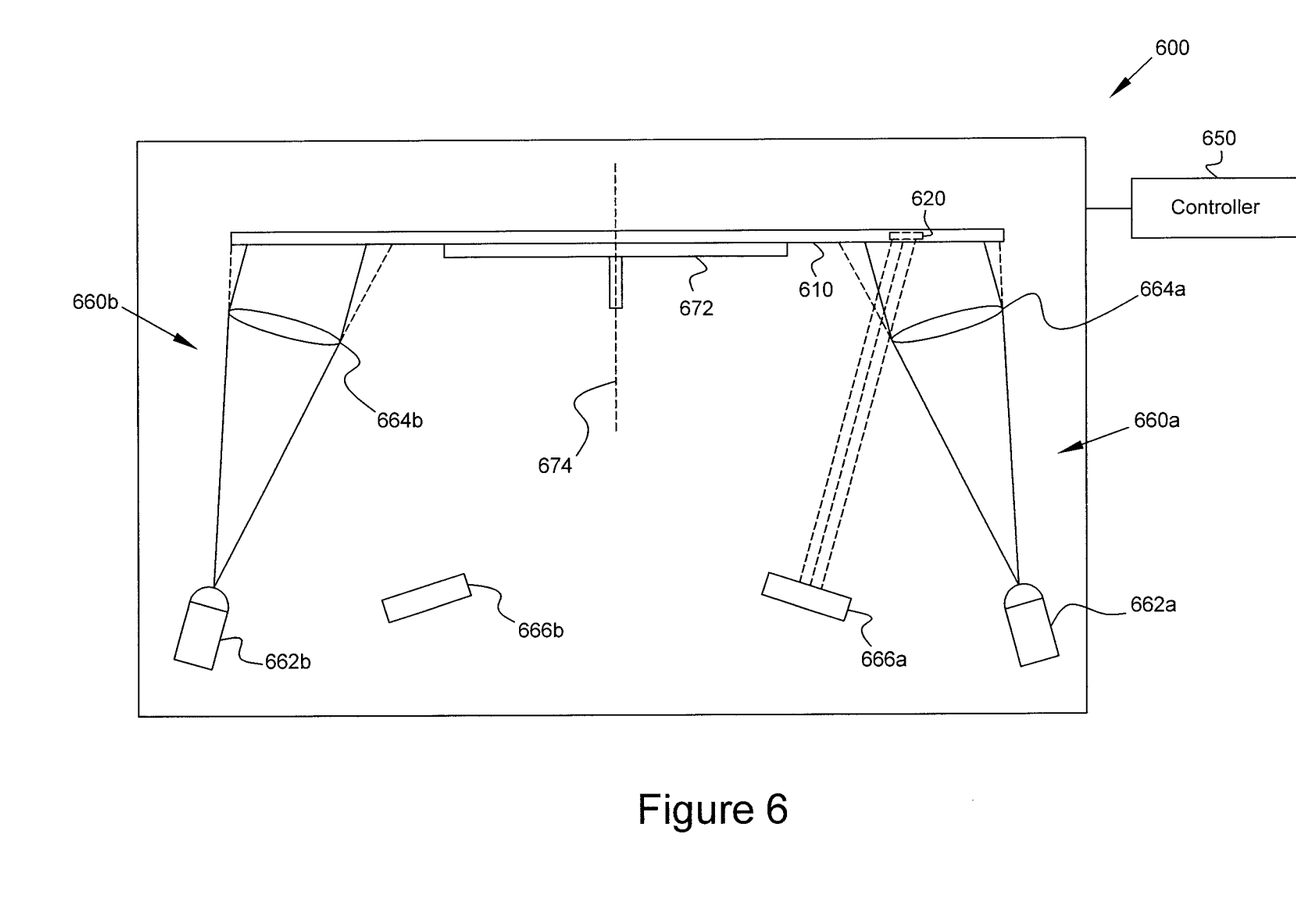
FIG. 6 is a schematic diagram illustrating a side view of a subsurface mark detecting apparatus according to some embodiments.

FIG. 6 is a schematic diagram illustrating a side view of an example of a subsurface mark detecting apparatus 600. Subsurface mark detecting apparatus 600 includes at least one subsurface mark detecting unit (660a). In the illustrated embodiment, two subsurface mark detecting units 660a and 660b are provided. As described above for subsurface mark detecting apparatus 500, subsurface mark detecting apparatus 600 can include a chuck 672 for supporting and/or retaining a semiconductor wafer 610 that can be rotatable about a central axis 674. In various embodiments, the subsurface mark detecting units 660a and 660b are positioned or movably positionable for detecting a subsurface mark 620 proximate a circumferential edge of the wafer 610. As shown in FIG. 6, the plurality of subsurface mark detecting units can include two subsurface mark detecting units 660a, 660b positioned or movably positionable on opposite sides of wafer 610 from each other to irradiate a portion of wafer 610 at a predetermined transmission angle relative to axis 674. In various embodiments, a thin film can be deposited on a surface, for example the upper surface, of wafer 610. In various embodiments, subsurface mark detecting units 660a, 660b can be positioned, or movably positionable, opposite the wafer 610 surface having a thin film deposited thereon.

In the illustrated embodiment, each subsurface mark detecting unit (660a, 660b) includes a light source 662a, 662b, a lens 664a, 664b, and a sensor 666a, 666b. Sensors 666a, 666b are positioned or movably positionable on opposite sides of wafer 610 from each other to receive reflected light at a predetermined reflectance angle relative to axis 674 at the intended reflectance point of the subsurface mark 620. The predetermined positioning of the light source 662a, 662b and the sensor are based on a light reflectance algorithm such that the angle of transmission of irradiated light ($\theta_T$) relative to axis 674 equals the angle of reflectance ($\theta_R$) relative to axis 674 and the reflected light received at the sensor 666a, 666b ($\theta_T=\theta_R$). In some embodiments, light source 662a, 662b can be a spot type or area type light source. In some embodiments, sensor 666a, 666b can be a spot type or area type light sensor. In some embodiments, subsurface mark detecting unit 660a, 660b can include a light filter (not shown), for example, an infrared filter. In various embodiments, subsurface mark detecting unit 660a, 660b detects subsurface mark 620 using light from light source 662a, 662b of a predetermined wavelength and at predetermined transmission ($\theta_T$) and reflectance ($\theta_R$) angles relative to axis 674. In various embodiments, the subsurface mark 620 can have an altered crystalline structure while the crystalline structure outside of the subsurface mark 620 can be maintained. Subsurface mark detecting apparatus 660a, 660b can be used to detect reflected light at a predetermined wavelength, at predetermined transmission ($\theta_T$) and reflectance ($\theta_R$) angles relative to axis 674 and relative to an intended reflectance point proximate a circumferential edge of wafer 610 where a subsurface mark 620 can be formed.

In various embodiments, light source 662a, 662b is an infrared light source that emits infrared light at a predetermined wavelength. In some embodiments, sensors 666a, 666b in subsurface mark searching unit 660a, 660b are infrared sensors. In various embodiments, light source 660a, 660b can be an x-ray source that emits x-rays at a predetermined wavelength. In some embodiments, sensors 666a, 666b in subsurface mark searching unit 660a, 660b are x-ray sensors or x-ray detectors. As described above for controller 550, controller 650 controls the apparatus to detect subsurface mark 620.

Figure 7:
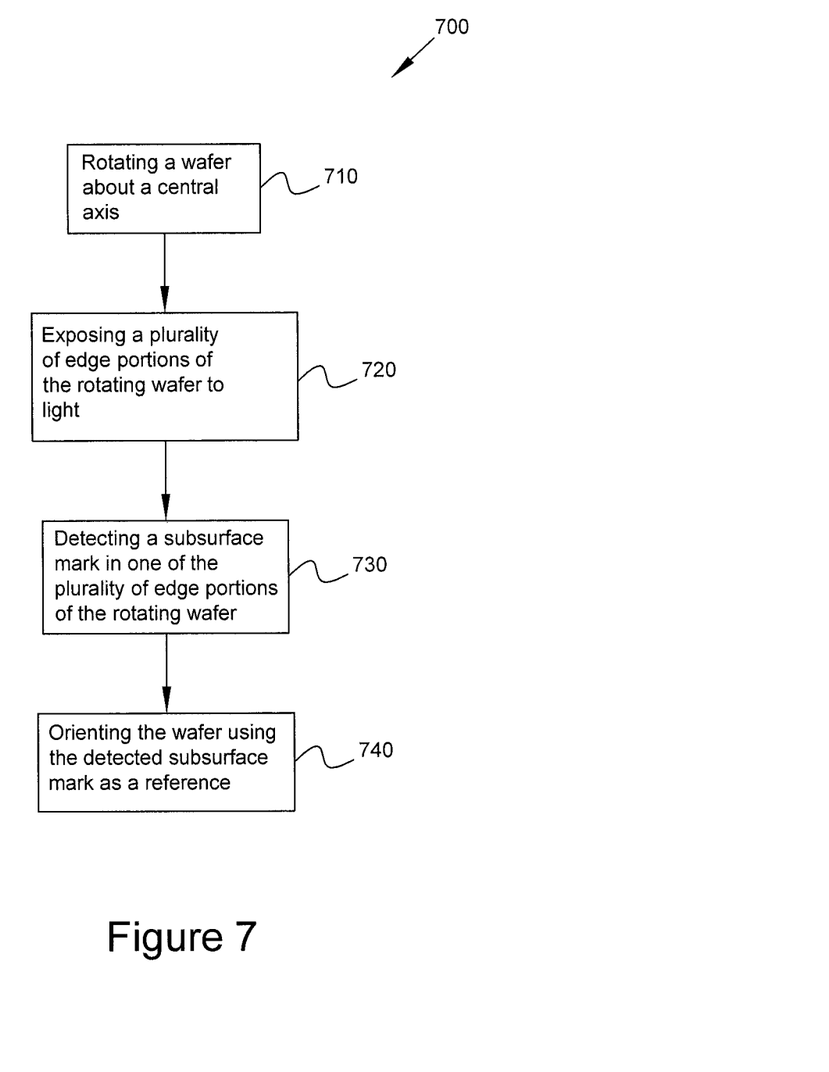
FIG. 7 is a flow chart illustrating a method of orienting a semiconductor wafer according to embodiments of the present disclosure.

FIG. 7 shows a flow chart illustrating a method of orienting a semiconductor wafer according to various embodiments. At block 710, a semiconductor wafer is rotated about a central axis. At block 720, a plurality of edge portions of the rotating wafer are exposed to light having a predetermined wavelength from one or more light sources. In various embodiments, one or more irradiating light sources can be tuned on to begin exposing a plurality of edge portions of the rotating light from the respective light sources to detect a subsurface mark. For example, an edge portion of the rotating wafer can be a portion of an edge exclusion area of a rotating wafer. In various embodiments, the predetermined wavelength is an infrared wavelength. For example, the predetermined wavelength can be between approximately 1.1 micrometers and 1.5 micrometers (e.g. 1.05 and 1.55 micrometers). In some embodiments, the predetermined wavelength is a x-ray wavelength. At block 730, a subsurface mark is detected in one of the plurality of edge portions of the rotating wafer. In various embodiments, a subsurface mark can be detected by monitoring for changes in light transmittance at the plurality of edge portions of the rotating wafer. For example, in the embodiment shown in FIG. 5, the detected light level at each pixel of the detectors 566a, 566b can be determined, to precisely identify the location of the mark 520. At block 740 the semiconductor wafer is oriented using the detected subsurface mark as a reference. In some embodiments, the subsurface mark can be used as a reference point for alignment of the wafer for a semiconductor process. In some embodiments, the subsurface mark can be used as a reference for wafer handling machinery. In various embodiments, the subsurface mark can be used as a reference point for alignment of the wafer for analysis of a mark on the functional portion of the wafer.

As shown by the various configurations and embodiments illustrated in FIGS. 1-7, various improved methods for fabricating and orienting semiconductor wafers have been described.

According to some embodiments, a method is provided. The method includes positioning a semiconductor wafer in a wafer retaining device, and irradiating a predetermined first portion of the wafer proximate a circumferential edge of the wafer, so as to alter a crystalline structure of at least part of the first portion of the wafer to form a subsurface mark. The subsurface mark is detectable using light.

According to various embodiments, a method of orienting a semiconductor wafer is provided. The method includes rotating a wafer about a central axis; exposing a plurality of edge portions of the rotating wafer to light having a predetermined wavelength from one or more light sources; detecting a subsurface mark in one of the plurality of edge portions of the rotating wafer; and orienting the wafer using the detected subsurface mark as a reference.

According to some embodiments, a method is provided. The method includes positioning a semiconductor wafer in a wafer retaining device, directing and focusing the laser at a subsurface portion of the wafer and altering a crystalline structure of the subsurface portion of the wafer to form a subsurface mark. The subsurface mark is detectable using light of a predetermined wavelength.

While various embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. Various modifications and variations can be made in the methods of the present subject matter without departing from the spirit and scope of the disclosure. Thus, it is intended that the claims cover the variations and modifications that can be made by those of ordinary skill in the art.

What we claim is:

1. A method, comprising:
   positioning a semiconductor wafer in or on a wafer retaining device;
   irradiating a predetermined first portion of the wafer in an edge exclusion area of the wafer, so as to alter a crystalline structure of a subsurface first part of the first portion of the wafer to form a subsurface mark, wherein the subsurface mark is detectable using light of a predetermined wavelength having a predetermined transmittance through the wafer and at a predetermined reflectance angle relative to an axis of rotation of the wafer and based on the predetermined wavelength.

2. The method of claim 1, wherein the step of irradiating comprises:
   directing a laser at the first portion of the wafer.

3. The method of claim 2, wherein the step of irradiating comprises:

directing and focusing the laser at the subsurface first part of the first portion of the wafer.

4. The method of claim 1, further comprising:
maintaining the crystalline structure of a second part of the first portion of the wafer, wherein the second part of the first portion includes a surface of the wafer, and wherein the first portion of the wafer is located along an axis of irradiation of the irradiating.

5. The method of claim 4, wherein the second part of the first portion includes a subsurface portion above the subsurface mark.

6. The method of claim 1, wherein the step of altering comprises:
melting the subsurface first part of the first portion of the wafer.

7. The method of claim 1, wherein the predetermined wavelength is an infrared or x-ray wavelength.

8. The method of claim 7, wherein the predetermined wavelength is at least 1.1 micrometers.

9. The method of claim 8, wherein the predetermined wavelength is between 1.1 micrometers and 1.5 micrometers.

10. The method of claim 1, wherein the retaining device comprises an electrostatic chuck.

11. A method of orienting a semiconductor wafer, comprising:
rotating a semiconductor wafer about a central axis;
exposing at least one edge portion outside of the functional area of the rotating wafer to non-visible light having a predetermined wavelength from one or more light sources;
detecting a subsurface mark in a subsurface part of one of the at least one edge portion of the rotating wafer at a predetermined reflectance point relative to the central axis and based on the predetermined wavelength; and
orienting the wafer using the detected subsurface mark as a reference.

12. The method of claim 11, wherein the orienting step includes:
using the subsurface mark as a reference point for alignment of the wafer for a semiconductor process.

13. The method of claim 12, wherein the predetermined wavelength is between 1.1 micrometers and 1.5 micrometers.

14. The method of claim 11, wherein the orienting step includes:
using the subsurface mark as a reference point for alignment of the wafer for analysis of a mark on the functional portion of the wafer.

15. The method of claim 11, wherein the predetermined wavelength is an infrared or x-ray wavelength.

16. The method of claim 11, wherein the material in the subsurface mark has a different crystalline structure than the portions of the wafer adjacent the subsurface mark.

17. The method of claim 16, wherein at least one of the portions of the wafer adjacent the subsurface mark is a subsurface portion above the subsurface mark.

18. The method of claim 11, further comprising:
filtering the light from the one or more light sources to the predetermined wavelength.

19. A method, comprising:
positioning a semiconductor wafer in or on a wafer retaining device;
irradiating a predetermined first portion of the wafer proximate a circumferential edge of the wafer, so as to alter a crystalline structure of a subsurface first part of the first portion of the wafer to form a subsurface mark, so that the subsurface first part has a different crystalline structure from a second part of the first portion of the wafer, wherein the subsurface mark is detectable using non-visible light of a predetermined wavelength and at a predetermined reflectance angle relative to an axis of rotation of the wafer and based on the predetermined wavelength, and the second part of the first portion includes a surface of the wafer.

\* \* \* \* \*